United States Patent [19]

Gloton et al.

[11] Patent Number: 5,470,411
[45] Date of Patent: Nov. 28, 1995

[54] METHOD FOR CONTINUOUS ASSEMBLY OF PATTERNED STRIPS AND INTEGRATED CIRCUIT MICROMODULE OBTAINED BY SAID METHOD

[75] Inventors: Jean-Pierre Gloton, Aix en Provence; Damien Laroche, Chateauneuf le Rouge; Joël Turin, Marseille; Michel Fallah, Aubagne, all of France

[73] Assignee: Gemplus Card International, Gemenos, France

[21] Appl. No.: 107,710

[22] PCT Filed: Feb. 18, 1992

[86] PCT No.: PCT/FR92/00158

§ 371 Date: Oct. 25, 1993

§ 102(e) Date: Oct. 25, 1993

[87] PCT Pub. No.: WO92/15118

PCT Pub. Date: Sep. 3, 1992

[30] Foreign Application Priority Data

Feb. 19, 1991 [FR] France .................... 91 01934

[51] Int. Cl.⁶ .................................................. B32B 31/00
[52] U.S. Cl. ................ 156/64; 156/83; 156/282; 156/351; 156/359; 156/543; 156/553
[58] Field of Search ................................. 156/282, 351, 156/359, 83, 64, 543, 553

[56] References Cited

U.S. PATENT DOCUMENTS 3,458,382  7/1969  Buck ........................ 156/543
4,295,912  10/1981 Burns ....................... 156/553
5,048,178  9/1991  Bindra et al. ............. 156/64

FOREIGN PATENT DOCUMENTS 0201952  11/1986  European Pat. Off. .
0296511  12/1988  European Pat. Off. .
0391790  10/1990  European Pat. Off. .
 608314  12/1978  Switzerland .
2031796   4/1980  United Kingdom .

OTHER PUBLICATIONS

Patent Abstracts of Japan, vol. 015114, Mar. 1991; JP3004543, Jan. 1991.

Patent Abstracts of Japan, vol. 014174, Apr. 1990; JP2026797, Jan. 1990.

Patent Abstracts of Japan, vol. 014401, Aug. 1990; JP2150101, Jun. 1990.

Primary Examiner—John J. Gallagher
Attorney, Agent, or Firm—Nilles & Nilles

[57] ABSTRACT

The method consists in pressure bonding a first strip to a second strip through a bonding press, marking each of the strips with the pattern pitches and juxtaposing the pattern pitch markings of each strip at the time of the bonding by extension of at least one strip with respect to another and by differential heating of each of the opposing strips to cause a relative shift, by expansion, of the two strips with respect to each other.

22 Claims, 4 Drawing Sheets

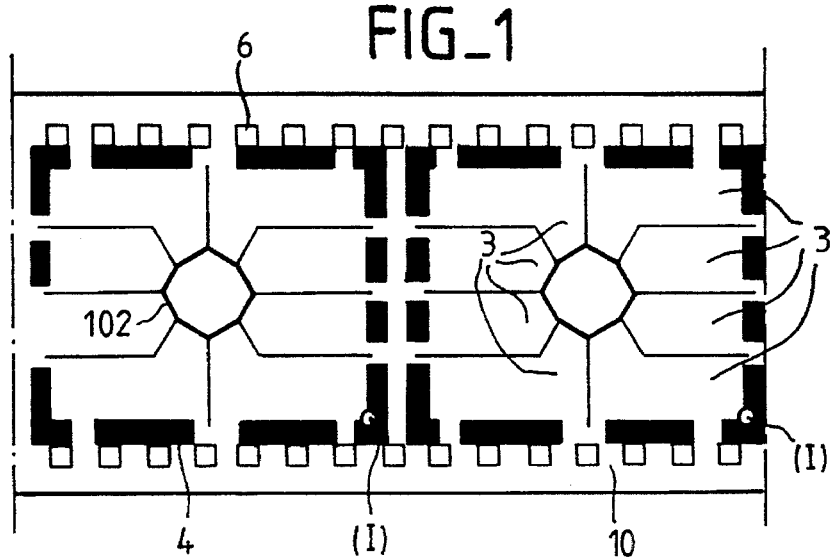
FIG_1
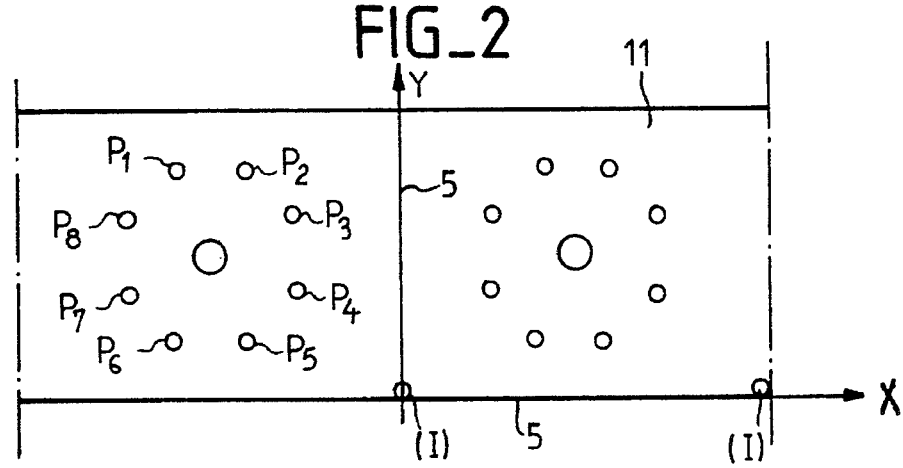
FIG_2
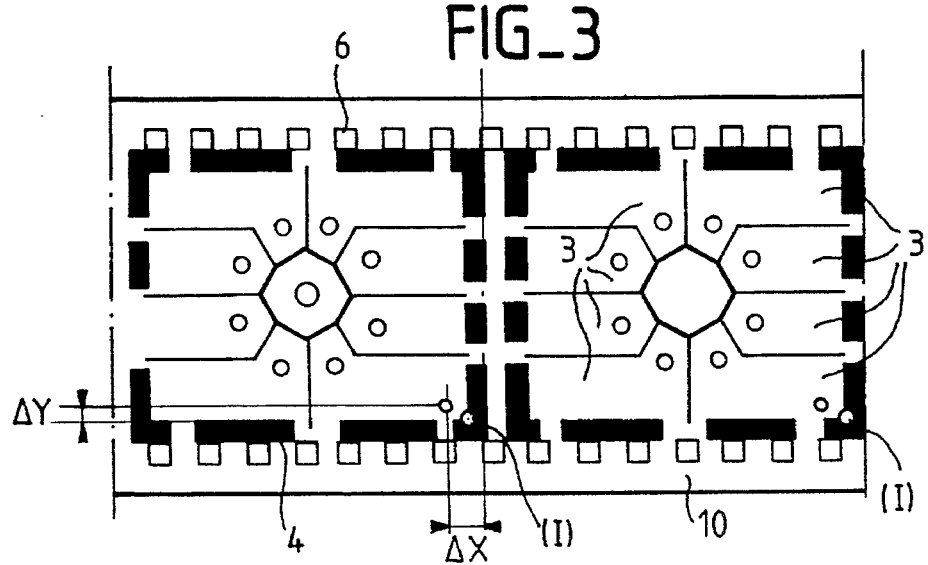
FIG_3

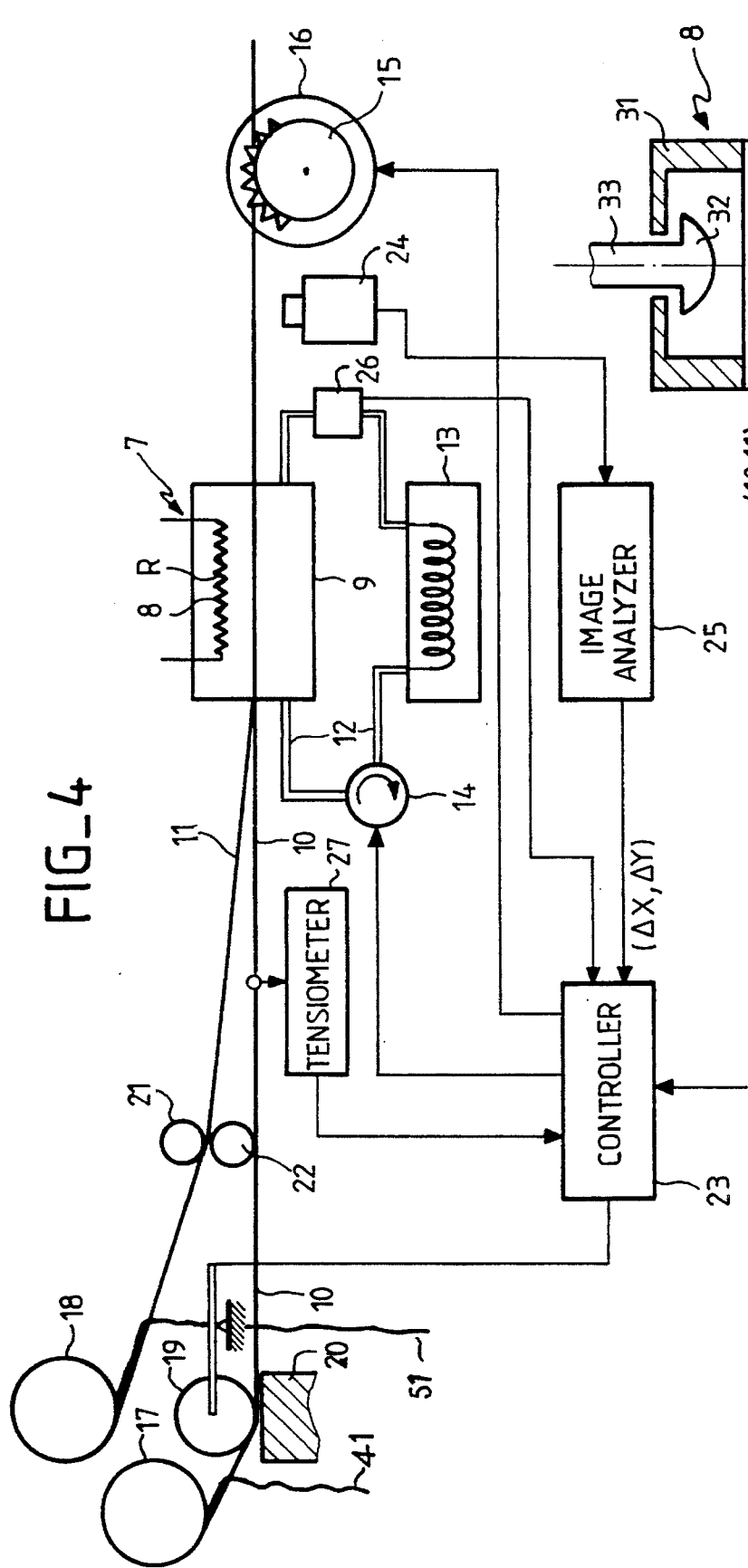

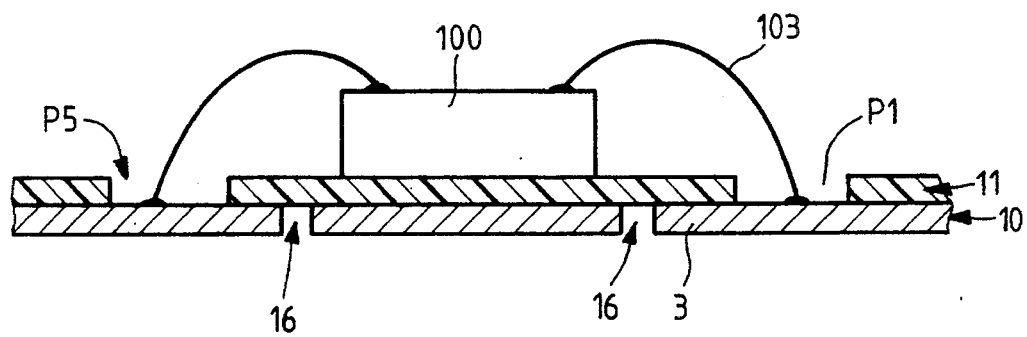
FIG_6
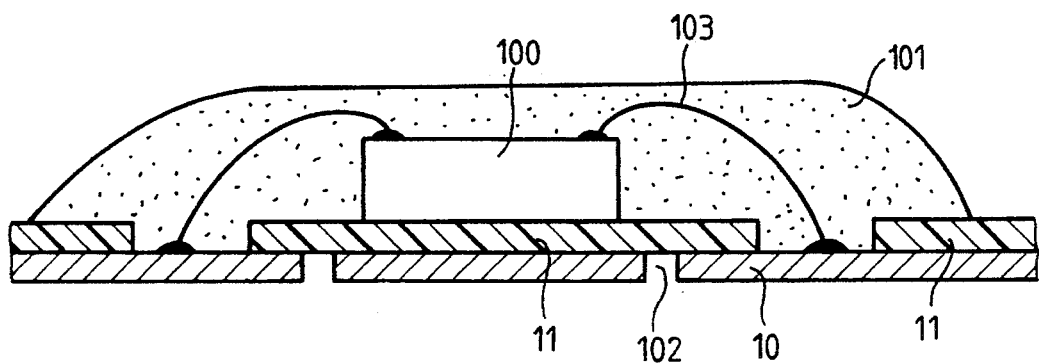
FIG_7
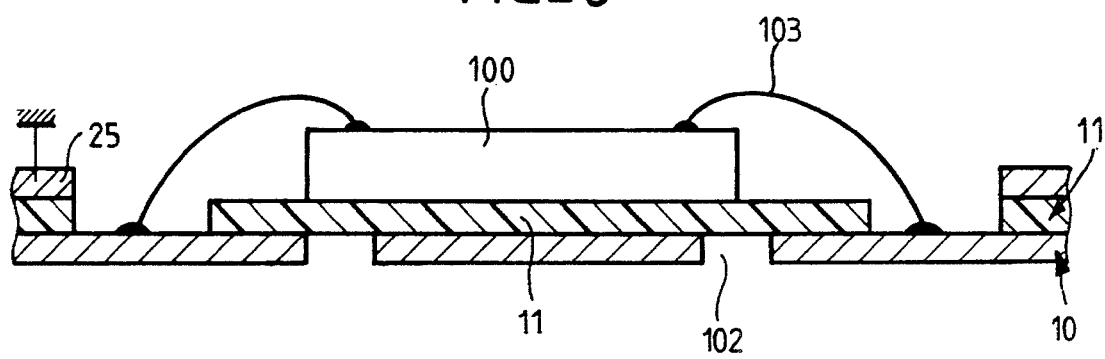
FIG_8

FIG_9
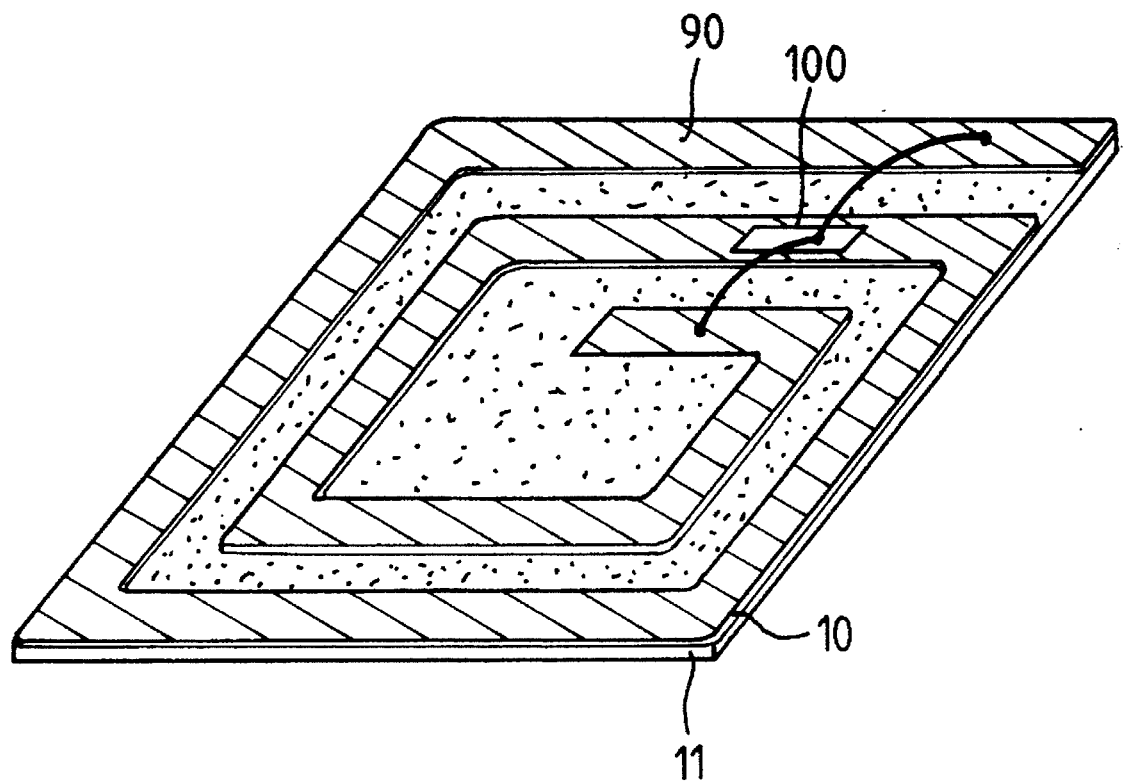

METHOD FOR CONTINUOUS ASSEMBLY OF PATTERNED STRIPS AND INTEGRATED CIRCUIT MICROMODULE OBTAINED BY SAID METHOD

BACKGROUND OF THE INVENTION

1. Field of the Invention

The present invention relates to a method for the continuous assembly of patterned strips.

It can be applied notably to the making of micromodules in integrated circuit form that go into the production of the portable flat cards known as "chip cards". In these cards, the micromodules are formed by a set of elements comprising: a chip in integrated circuit form, metal contacts used for the connection of the micromodule with external devices, linking wires to link the chip to the metal contacts and a protective coat formed by a resin covering the chip, the linking wires and, partially, the metal contacts.

2. Discussion of the Related Art

To manufacture a micromodule and then incorporate it into a card, a first known method consists in mounting the chip on a metal strip that has been pre-slotted in the form of a conductor grid, soldering the chip to a zone of this grid where it is connected by wires soldered to other zones of the grid, coating the chip and the wires with a drop of protective resin of the epoxy or silicone type in leaving the conductors of the grid partially bared, cutting up the metal strip into individual micromodules, each comprising a coated chip and bared external contacts and then bonding the micromodule to a surface cavity of a card made of plastic material in such a way that grid portions not coated with resin are flush with the surface of the card and constitute the external connector of the card.

According to a second method which is also known, the initial pre-cut metal strip is replaced with a metallized dielectric strip etched with a connection pattern to be determined. The dielectrical strip, in this case, forms the main support of the chip. The connections have a very small thickness and are obtained by the pre-deposition of a metal layer on the photo-etching plastic strip of this metal layer. The chip is connected by soldered wires to zones of the metallized layer.

These methods have a certain number of drawbacks. In the case of the use of a pre-cut metal strip, the encapsulation resin of the micromodule adheres poorly to the conductors of the grid, all the more so as, in practice, the resin is on only one side of the strip, the other side being reserved to leave the conductors accessible to act as connectors. The result thereof is a problem of reliability that is difficult to resolve, caused chiefly by the passage of moisture between the resin and the conductors.

In the case of the use of a metallized and photo-etched dielectric strip, the strip musk necessarily be made of a sufficiently rigid material, and must stand up well to temperature so as not to get warped when the temperature rises, which makes it necessary for the definition of the conduction pattern to be executed only by photo-etching on the dielectric strip and makes this second method far costlier than a mechanical cutting-out operation for example.

A third method is known through the European patent application published under No. 0 296 511 and filed under No. 88 1097430 on 18th Jun. 1988.

This patent application relates to a method for the manufacture of a ribbon designed to provide modules to equip electronic cards also called "smart cards". However, the approach proposed in this patent application is not satisfactory.

Indeed, this method entails taking a metal strip with a thickness that is typically equal to 75 micrometers but may vary between 50 micrometers and 150 micrometers. This strip is provided with perforations enabling it to be carried along and apertures obtained by stamping that demarcate the arrays of conductors of the circuits. A set of 125-micrometer-thick insulating foils having, on one face, a thermoplastic or thermosetting material for hot bonding, is also taken. The foils have a set of holes with an arrangement that corresponds to the location of the connections and a central hole for the location of the circuit.

The foils are bonded to the metal strip by heating. The heating prompts a certain shrinkage of the insulator material which makes it difficult to use bigger foils, especially in the longitudinal direction. With cold bonding, the problem would not arise. By contrast, the adhesion to the metal is poor.

Furthermore, it is imperatively necessary to make a perforation in each insulator foil at the position reserved for the circuit in order to house the circuit therein and thus keep within the requisite tolerances as regards thickness for the manufacture of the chip cards.

Reference could also be made, as part of the prior art, to the document GB 2031796 A which describes a device for the assembling of an adhesive insulator strip to a conductive strip. In the device described, the adjusting of the tension is done only on the insulator strip by modifying the rotational speed of the wheels between which this strip passes. A device such as this does not enable the use of very thin 30 to 50 μm insulator strips as is made possible by the invention.

OBJECTS AND SUMMARY OF THE INVENTION

The present invention makes it possible to overcome these problems.

Its object is a method for the continuous assembly of patterned strips. Apart from the advantage of continuous manufacture, the method also enables the use of a strip of insulator material with a far smaller thickness than is commonly used as an insulator thickness. This means that the manufacturer can be allowed the choice, as a function for example of the use that will be made, of placing the circuit either on the insulator strip or on the metal strip. Indeed, according to the invention, the dielectric strip may have a very small thickness of the order of 30 to 50 micrometers instead of 100 to 200 micrometers.

The bonding of an integrated circuit chip may consequently take place between the thin dielectric strip, the formation of the electrical connections to the chip then taking place through the slots of the dielectric strip. In any case, the total thickness of the micromodule is thus considerably reduced by a decisive ratio which gives the possibility of manufacturing very flat chip cards.

Should the chip be bonded to the dielectric strip instead of being bonded to the metal surface, there is an additional safety factor, for the thin dielectric placed under the chip can then play a role of a plastic buffer preventing possible deterioration. Furthermore, the method according to the invention can do away with cases of incompatibility which have been encountered by the applicant during the bonding of the dielectric strip to the metal grid which should take place at a temperature close to 200° C. and should prompt a differential expansion between the two materials, causing imprecision in the juxtaposition of the patterns of the dielectric strip above those of the metal grid. The method according to the invention makes it possible to resolve the problem of the relative conservation of the dimensions of the patterns in the longitudinal and transversal directions of the strips and their respective positioning when these strips are engaged between pinch rollers of bonding machines. A beginning of an approach to this problem may consist, for example, in planning the overlapping pitch of the patterns as a function either of the expected bonding temperature or of the elasticity of the strips, or by stretching, for example, one of the two strips. However, the adjustment of the overlapping pitch values as a function of the bonding temperature lacks flexibility for the overlapping pitch of the strips should then be modified whenever the bonding temperature or the nature of the materials constituting the strips is modified, the stretching of the strips being valid only for low temperatures and expansion differences.

Thus the proposed method for the continuous assembly of patterned strips consists in pressure bonding a first strip to a second strip through a bonding press, marking each strip with the pattern pitch and juxtaposing the pattern pitch markings of each strip at the time of the bonding by extension of at least one strip with respect to another, and/or by differential heating of each of the opposing strips to cause a relative shift, through expansion, of the two strips with respect to each other.

An object of the invention is also an integrated circuit micromodule comprising a pre-slotted metal grid, a perforated dielectric strip with a thickness of less than 70 micrometers, a chip bonded either to this dielectric strip or to the metal strip through a perforation of the dielectric strip and connected to the metal strip through other perforations of the dielectric strip.

An object of the present invention is also a device for the continuous assembly of patterned strips, one of which is a pre-slotted metal strip and the other is a pre-perforated insulator strip, comprising grip feeding means comprising a first strip unwinder on which there is mounted the metal strip wound on itself with an interposed strip preventing the imbrication of the patterns, a second strip unwinder on which the insulator strip is mounted, said strip being wound on itself with an interposed strip, characterized in that it comprises means for the marking, on each of the strips, of the pattern pitches, means for adjusting the tension of either of the strips and means for adjusting this tension that enables the prompting of a differential heating of each of the opposing strips, to obtain a relative shift, by expansion, of the two strips with respect to each other.

An object of the present invention is also an integrated circuit module in which the dielectric strip covering the grid constitutes the dielectric of an electromagnetic transmission or reception antenna, the pre-slotted grid of which constitutes an active part.

BRIEF DESCRIPTION OF THE DRAWING

Other characteristics and advantages of the present invention shall appear from the following description, made with reference to the appended drawings, of which:

FIG. 1 is a top view of a pre-slotted metal strip according to the invention;

FIG. 2 is a top view of a perforated dielectric strip according to the invention, designed to be bonded to the metal strip of FIG. 1;

FIG. 3 is a view showing the juxtaposition of the two strips being bonded;

FIG. 4 shows a device for the implementation of the method according to the invention;

FIG. 5 represents a press used for the implementation of the method according to the invention;

FIG. 6 shows the micromodule manufactured according to the invention, at an intermediate stage of manufacture;

FIG. 7 shows a micromodule according to the invention, at a final stage of manufacture;

FIG. 8 represents a micromodule constituting a transmission/reception antenna;

FIG. 9 represents a micromodule constituting an identification label.

DETAILED DESCRIPTION OF THE PREFERRED EMBODIMENT

The pre-slotted metal strip 10 which is shown in FIG. 1 is formed by a strip of copper or tinned copper with a thickness of about 35 to 70 micrometers. Its width is defined to correspond to the final connection width to be obtained, and may be of the order of one centimeter to some centimeters as the case may be. It is slotted with a repetitive pattern 102 which, as the case may be, is done by stamping to define the separate contacts 3 used as connection pins between the interior and the exterior of the micromodule to be assembled on the strip.

In the representation shown in FIG. 1, which is given by way of an example, the pattern 102 is the one that enables the connection of a micromodule for flat chip cards, the contacts shown being eight in number. The eight separate contacts 3 can be seen inside a closed line 4. These contacts are separated by cutting lines 5 that cut out the patterns 102. Outside the line 4, the contacts are joined to ensure the continuity of the strip from one micromodule to another.

The strip 10 comprises regular perforations 6 distributed along the longitudinal edges of the strip on one or both of its sides. These perforations are used to carry the strip along by a toothed wheel system.

The slotted metal strip forms the main support of the chips constituting the core of the micromodules. This strip is covered with a dielectric strip of the type shown in FIG. 2, comprising pre-cut perforations ($P_1$–$P_8$) designed to come before conductive zones 3 of the conductive pattern cut out of the metal strip 10. An indexing hole (I) serves as a reference mark and enables the precise positioning of the perforations ($P_1$–$P_8$) facing the conductive zones 3 during the operation for the hot bonding of the two strips to each other. As clearly illustrated in FIG. 1, a corresponding reference mark is foraged in the metal strip 10 in the form of an indexing hole (I).

As indicated in FIG. 3, the indexing hole (I) of each strip is located, when the bonding operation is terminated, at the intersection of the two bonding axes, respectively the horizontal axis X and the vertical axis Y formed by the cutting lines 5. This positioning is done by the strip assembling device shown in FIG. 4.

This device comprises a press 7 comprising two plates or, possibly, two juxtaposed rollers 8 and 9, between which there move patterned strips 10 and 11 that have to be assembled by bonding. In FIG. 4, the upper plate or roller 8 is heated up to a bonding temperature of about 200° C. by an electrical resistor R supplied by an external electrical current supply device (not shown). The lower plate 9 is cooled by a water circulation circuit 12 going through a heat pump type of temperature exchanger 13 or any other equivalent device activated by a pump 14. The strips 10 and 11, once bonded, are carried along in a translation motion between the two plates or rollers 8 and 9 by a sprocket wheel 15, the teeth of which engage in the perforations 6 of the support strip or cross-motion clamp system. The sprocket wheel 15 is moved by a motor 16. The strips 10 and 11 are paid out respectively from two loading rollers 17 and 18. Indeed, in order to obtain a continuous assembly of the strips 10 and 11, these strips are each mounted on an unwinder and moved by a motor (not shown).

The strip 10 is mounted on the roller 17 while the strip 11 is mounted on the roller 18. The strip 10 is wound on itself with an interposed strip 41 that falls as and when the strip 10 unwinds. This interposed strip 41 prevents the patterns from getting imbricated with one another. The strip 11 is also wound on itself. An intercalary strip 51 may be planned too, to prevent problems during the unwinding of the strip 11.

The traction of the supporting strip 10 is adjusted by a presser wheel 19 on a beam 20 of the supporting strip 10. The beam 20 then retains the strip 10 by friction and procures the tension of this strip. The tension of the strip to be bonded 11 is adjusted by two pinch rollers 21 and 22 with calibrated friction. A controller 23 provides, firstly, for the rotational control of the motor 16 and the pump 14 and, secondly, for that of the presser wheel 19. The controller 23 receives information elements coming, firstly, from a camera 24 by means of an image analyzer 25 and, secondly, a temperature sensor 26 connected to the fluid circulation circuit 12, as well as a device 27 formed by a tensiometer or any other equivalent device to measure the tension of the supporting strip 10. Thus when the two strips 10 and 11 driven by the traction of the motor 16 move past under the rollers or between the two plates 8 and 9, the image analyzer 25 can permanently provide information on the offset Delta X and Delta Y of the reference hole or indexing hole (I) with respect to the reference axes X and Y of each pattern. The value of this arrangement is that, through the controller 23, it enables action jointly or separately on the pressure exerted on the strip 10 or the strip 11 respectively, by the presser wheel 19 in order to adjust the tension of the strip 10 or the strip 11 by the pinch rollers 21 and 22 and by the adjusting of the temperatures of the two plates or pinch rollers 8 and 9 in order to adjust, by extension or expansion, the position of one strip with respect to the other one to obtain the coinciding of the indexing holes of the two strips by canceling the offsets Delta X and Delta Y of the reference hole with respect to the reference axes X and Y. It must be noted, however, that an adjusting of the pitch by the simple extension of one of the two strips in relation to the other is valid only for the small offsets Delta X and/or Delta Y of the values of the pitch, and that big offsets can be efficiently compensated for only by an adjustment of the relative temperatures of the plates or rollers 8 and 9 with respect to each other. In practice, when an offset Delta X exceeds a predetermined threshold, the compensation for this offset is achieved by the controller 23 acting on the cooling of the plate 9. In the case of small offsets, the compensation is achieved by acting on the pinch rollers 19 or 21, 22. However, for the system to work efficiently, it is preferable to apply the strip that has the highest expansion coefficient to the plate or roller 9 which is cooled, the other strip 11 being applied to the plate or roller 8 that is heated. Thus, for example, for a bonding of a copper roll which has an expansion coefficient of $17 \times 10^{-6}/°C$. on a roll of a plastic material, commercially available under the registered mark "Kapton", which has an expansion coefficient of $20 \times 10^{-6}/°C$., the Kapton should be applied to the plate or roller 9 and the copper to the plate or pinch roller 8.

During the bonding operation, it should naturally be seen to it, when the plates/rollers 8 and 9 come under pressure, that these elements 8 and 9 move properly solely in the direction Z normal to the plane (X, Y) of the two strips. The problem can be resolved easily by using either column presses or presses with distribution springs. However, to avoid having the positions, between the axes, that evolve with the temperatures, it is desirable, in the case of the column presses, to use steels with a low expansion coefficient by using, for example, steel that is commercially distributed under the known registered mark Invar for example.

The approach using a rod-type press, a diagram of the embodiment of which is shown in FIG. 5, has the advantage of being easy to make and of providing homogeneous pressure between the two plates. As can be seen in FIG. 5, where the elements homologous to those of FIG. 4 are shown with the same references, a press comprises a lower plate 9 formed by a steel board 28 mounted on an insulating board -29 and an upper plate 8 formed by a steel board 30 comprising a hollow insulating cap 31 enclosing the head 32 of a rod 33. The steel board 28, on its surface facing the steel board 30, has distribution springs 34 which enable the rod head 32, the steel board 30 and the spring 34 to be all in contact together before the pressure of the two boards 28 and 30 is exerted on the two strips 10 and 11, thus preventing any motion in the directions X and Y during the clamping of the two boards.

Once the bonding is done, it can be further homogenized, possibly by a second press (not shown), which then has the same temperatures on both plates, or by two rollers similar to those already used in the prior art.

Naturally, the method that has just been described can equally well be applied with the same efficiency for the indexed assembly of any material with identical or multiple pitch patterns. The method can also be applied to the bonding of any number N of strips by the interposing of N pre-bonding presses before the homogenization station. The usefulness then is that it enables the making of multilayer films continuously.

Thus the method according to the invention enables the manufacture of integrated circuit micromodules, this manufacture comprising the formation of a pre-slotted metal strip comprising notably regular perforations enabling the strip to be carried along by toothed wheel (as with the forward feed of a cinema film), the formation of a very thin perforated dielectric strip and then the bonding of the two strips to each other, the bonding of an integrated circuit chip to the thin dielectric strip and the formation of electrical connections between the chip and the metal strip through the slots of the dielectric strip. In principle, the electrical strip will be narrower than the metal strip: it will include no periodic lateral slots enabling it to be carried along by toothed wheel and furthermore, it will generally be too thin to be carried along by a toothed wheel. During the bonding of the dielectric strip to the metal strip, the slots enabling the metal strip to be carried along will not be covered by the dielectric strip owing to the smaller width of this strip.

The other manufacturing operations may be standard ones, for example: the deposition of a drop of resin to coat the chip and the connections with the chip, on the dielectric strip side but not on the metal strip side, and possibly the levelling down of the drop to a determined height; the separation of the micromodule from the rest of the strip. The micromodule is then ready to be inserted into a cavity of a plastic card.

It is furthermore observed that, by this method, it is no longer the dielectric strip that is used to carry the unit along during the assembly line manufacture of micromodules out of a continuous strip, as might have been the case in the prior art technique when a dielectric strip was provided for. The thickness of the dielectric strip is far smaller than in the prior art, 30 to 50 micrometers instead of 100 to 200 micrometers for example. This is very important, for the total thickness of the micromodule is a decisive factor for the possibility of making very flat chip cards.

Furthermore, in view of this very small thickness, the chip may be bonded to the dielectric strip or to the metal strip. Cases where it is not necessary to provide for a rear face contact are indeed frequent in CMOS technology. When mechanical stresses are exerted on the card, the thin dielectric placed beneath the card plays the role of an elastic buffer which, in certain cases, prevents the chip from deterioration.

During the manufacture, the small thickness of the dielectric strip facilitates a very efficient bonding of the two strips to each other, without any risk of their getting separated during the subsequent treatment.

Finally, another advantage of the invention is that the bonding of the chip to the dielectric makes it possible to provide for only one micromodule manufacturing line, whatever the dimension of the chip to be encapsulated, this being achieved with a single model of pre-slotted metal strip, the sole condition being that there should be provided a modifiable or detachable punching tool for the formation of the slots in the electrical strip; indeed, the chip is insulated from the metal grid, and only the location of the perforations in the dielectric defines the position of the connections between the chip and the grid. For a larger-sized chip, the perforations will be placed at a greater distance from the center of the chip. For a smaller chip, the perforations will be brought closer to the center. It is naturally sufficient for the perforations to remain above the appropriate metal zones, but these zones may be fairly wide in the case of micromodules with a small number of external contacts (6 or 8 for example).

The invention also relates to a micromodule comprising a slotted metal grid bonded to the very thin perforated dielectric strip (thickness preferably smaller than 50 micrometers, more generally between 30 and 70 micrometers), with a chip bonded either to the metal strip or to the dielectric strip and connected to the metal strip through the perforations of the dielectric strip.

FIG. 6 shows the composite strip bearing a chip 100 at this stage of manufacture. The references are the same as in the foregoing figures.

The chip 100 is then coated with a protective insulator 101, preferably an epoxy resin or a silicone resin that can be deposited in drops above the chip (FIG. 7).

It will be noted that, contrary to what happens in the technique using a slotted metal strip without dielectric, the resin cannot flow between the conductors 103, i.e. in the slots 102 of the metal strip since, in principle, all these slots 102 are covered with the dielectric strip, at least in the part that will constitute the micromodule after the slotting of the strip.

The mechanical stresses on the chip are particularly low during and after the manufacture owing to the interposition, between the metal and the chip, of a small thickness of polyimide which behaves like a buffer of plastic material. This is important when the micromodule is incorporated into a flat chip card for these cards are subject to very substantial twisting and bending stresses.

Given that it is possible to be satisfied with a very small thickness of dielectric, the height of the micromodule remains limited to an acceptable value despite the fact that the chip lies on the dielectric. By way of an indication, the chip may have a thickness of about 250 micrometers and the strips 10 and 11 a thickness of about 50 micrometers each.

The encapsulation resin adheres to a dielectric surface, which is better than if it were to adhere to a metal surface. There is no risk of any penetration of moisture up to the chip which is surrounded with resin wherever it does not touch the dielectric strip.

When the micromodule is finished (FIG. 7), if necessary, after the levelling down of the resin to a maximum desired height, it is separated from the rest of the strip by being cut out mechanically along the line 4 of FIGS. 1 and 2. If it is a micromodule for chip cards whose connector is constituted by the accessible face of the conductors 103, the micromodule is placed in a cavity of the chip card, the face that bears the chip being pointed towards the bottom of the cavity and the conductors remaining accessible at the upper part.

In one improvement of the invention (cf. FIG. 8), which is especially promising in the case of chip cards working in microwave applications and designed to receive and/or send an electromagnetic radiation, it is possible to provide for an arrangement where the dielectric strip 11 constitutes the dielectric of a radiating antenna, of which the slotted grid 10 constitutes an active part. The antenna 90 is of the microstrip type constituted, for example, by conductors cut out in the metal strip and acting as antennas instead of as connectors. An electrical ground plane 25 can then be provided for on the other side of the dielectric. This ground plane can be formed either by means of a second metal strip 10 mechanically cut out and bonded to the upper face of the dielectric strip 11 before the positioning of the chips or by means of a photo-etched metallization on the upper face of the dielectric. Conversely, it can be provided for the ground plane to be beneath (formed in the metal strip 10) and the microstrip antenna above (formed in the metallization of a metallized dielectric strip 11, or formed in a second metal strip bonded to the side of the chip).

According to the alternative embodiment, the micromodule may constitute an identification label. To this end, the grid 10 forms an inductor 90. The chip 1004 can be placed in a metal zone and can be connected to both ends of the inductor 90. Advantageously, a low-cost dielectric will be used, for example cardboard. A micromodule such as this is shown in FIG. 9 and constitutes a low-cost identification label.

We claim:

1. Method for the continuous assembly of patterned strips, one of which is a pre-slotted metal strip and the other a pre-perforated insulator strip, comprising providing each of the strips with reference marks, continuously unwinding the strips from respective feeder rollers, continuously transporting the strips through a bonding press under tension, sensing the locations of said reference marks, pressure bonding the first strip to the second strip through the bonding press, and, in response to said sensing step, juxtaposing the reference marks of each strip at the time of the bonding by at least one of (1) varying the tension applied to at least one of said strips so as to extend one strip with respect to the other, and (2) differentially heating each of the opposing strips to cause a relative shift, by expansion, of the two strips with respect to each other.

2. Method according to claim 1, wherein the bonding is performed using a plate press comprising a first plate that is electrically heated and a second plate that is cooled by the circulation of a fluid.

3. Method according to claim 2, further comprising implementing a controller to adjust the temperatures of the two plates and the values of tension of the two strips.

4. Method according to claim 3, characterized in that the press is a column press, the plates of which are made of materials with a low coefficient of expansion.

5. Method according to claim 3, characterized in that the press is a rod-type press.

6. Method according to claim 1, wherein said sensing step comprises identifying the relative position of the reference marks by a television camera coupled to a controller by means of an image analyzer.

7. Method according to claim 1, characterized in that the first patterned strip is made of copper and the second patterned strip is made of a plastic material having an expansion coefficient of $20 \times 10^{-6}/°C$.

8. Method according to claim 2, characterized in that the patterned strip which has the highest expansion coefficient is applied to the plate cooled by the circulation of a fluid.

9. A method for the continuous assembly of patterned strips including a first, pre-slotted metal strip and a second, pre-perforated insulator strip, said first and second strips having different coefficients of expansion, said method including:

(A) providing said first and second strips with reference marks;

(B) continuously unwinding said first and second strips from respective feeder rollers; then (C) continuously transporting said strips through a bonding press;

(D) pressure bonding said first strip to said second strip in said bonding press during said transporting step;

(E) sensing the locations of the reference marks; and (F) in response to said sensing step, juxtaposing the reference marks of each strip at the time of the bonding by differentially heating said strips to cause a relative shift, by expansion, of the two strips with respect to each other.

10. The method as defined in claim 9, further comprising detecting an offset amount which must be canceled to provide juxtapositioning of said reference marks, wherein said heating step comprises differentially heating said strips by an amount equal to that which is required to provide cancellation of said offset.

11. The method as defined in claim 10, wherein said heating step is performed whenever the detected offset amount is determined to be more than a designated value, and further comprising juxtaposing the reference marks when the detected offset amount is less than said designated value by adjusting the tension applied to at least one of said strips.

12. A method as defined in claim 10, wherein said detecting step comprises identifying the positions of the reference mars by a television camera coupled to a controller by means of an image analyzer.

13. A method as defined in claim 9, wherein the press comprises a plate press including a first plate that is electrically heated and a second plate that is cooled by the circulation of a fluid, and wherein the heating step comprises at least one of (1) adjusting the amount of heating of said first plate and (2) adjusting the amount of cooling of said second plate.

14. A method as defined in claim 13, wherein the strip which has the highest expansion coefficient is applied to the plate cooled by fluid circulation.

15. The method as defined in claim 9, wherein said providing step comprises forming indexing holes in said strips.

16. Device for the continuous assembly of patterned strips, one of which is a pre-slotted metal strip and the other is a pre-perforated insulator strip, each of said strips having reference marks, said device comprising: (A) strip feeding means including (1) a first strip unwinder on which is mounted the metal strip wound on itself, (2) a second strip unwinder on which is mounted the insulator strip wound on itself, and (3) means for continuously transporting both strips to and through a press located downstream of the unwinders, (B) means for sensing me positions of said reference marks, (C) means, responsive to said means for sensing, for juxtaposing the reference marks of said strips by adjusting the tension on at least one of said strips to thereby extend one strip with respect to the other, and (D) means, responsive to said means for sensing, for juxtaposing the reference marks of said strips by differentially heating each of the opposing strips to obtain a relative shift, by expansion, of the two strips in relation to each other.

17. Device according to claim 16, characterized in that the pressure bonding means comprise a plate press comprising a first plate that is electrically heated and a second plate that is cooled by the circulation of a fluid.

18. Device according to claim 17, further comprising control means for adjusting the temperatures of the two plates.

19. Device according to claim 18, characterized in that the control means enables the adjusting of the values of tension of the two strips.

20. Device according to claim 17, characterized in that the press is a column press, the plates of which are made of materials with a low coefficient of expansion.

21. Device according to claim 17, characterized in that the press is a rod press.

22. Device according to claim 16, characterized in that the sensing means comprise a television camera coupled to a controller by means of an image analyzer.

* * * * *